US010559671B2

(12) United States Patent
Jagannathan et al.

(10) Patent No.: US 10,559,671 B2
(45) Date of Patent: Feb. 11, 2020

(54) VERTICAL TRANSPORT FIELD-EFFECT TRANSISTOR INCLUDING AIR-GAP TOP SPACER

(71) Applicant: International Business Machines Corporation, Armonk, NY (US)

(72) Inventors: Hemanth Jagannathan, Niskayuna, NY (US); Choonghyun Lee, Rensselaer, NY (US); Alexander Reznicek, Troy, NY (US); Christopher Waskiewicz, Rexford, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/404,704

(22) Filed: May 6, 2019

(65) Prior Publication Data

US 2019/0259854 A1    Aug. 22, 2019

Related U.S. Application Data

(62) Division of application No. 15/831,340, filed on Dec. 4, 2017, now Pat. No. 10,319,833.

(51) Int. Cl.
*H01L 29/66* (2006.01)
*H01L 29/06* (2006.01)
*H01L 29/78* (2006.01)

(52) U.S. Cl.
CPC .... *H01L 29/66553* (2013.01); *H01L 29/0653* (2013.01); *H01L 29/6653* (2013.01); *H01L 29/6656* (2013.01); *H01L 29/66666* (2013.01); *H01L 29/7827* (2013.01)

(58) Field of Classification Search
CPC .......... H01L 29/66553; H01L 29/6656; H01L 29/7827; H01L 29/66666; H01L 29/0653; H01L 29/6653
See application file for complete search history.

(56) References Cited

U.S. PATENT DOCUMENTS

| 7,297,600 B2 | 11/2007 | Oh et al. |
| 8,637,930 B2 | 1/2014 | Ando et al. |
| 9,305,835 B2 | 4/2016 | Alptekin et al. |
| 9,368,572 B1 | 6/2016 | Cheng et al. |
| 9,443,982 B1 | 9/2016 | Balakrishnan et al. |
| 9,570,356 B1 | 2/2017 | Balakrishnan et al. |
| 9,735,246 B1 | 5/2017 | Basker et al. |
| 9,680,473 B1 | 6/2017 | Anderson et al. |
| 9,805,935 B2 | 10/2017 | Anderson et al. |

(Continued)

OTHER PUBLICATIONS

Hemanth Jagannathan et al., Unpublished U.S. Appl. No. 15/831,340, filed Dec. 4, 2017, entitled Vertical Transport Field-Effect Transistor Including Air-Gap Top Spacer, pp. 1-24 plus 7 sheets formal drawings.

(Continued)

*Primary Examiner* — Laura M Menz
*Assistant Examiner* — Candice Chan
(74) *Attorney, Agent, or Firm* — L. Jeffrey Kelly; Otterstedt, Wallace & Kammer, LLP (57) ABSTRACT

A vertical transport field-effect transistor includes a top source/drain region separated from an underlying gate stack by a top spacer including open gaps to reduce capacitance therebetween. Techniques for fabricating the transistor include using a sacrificial spacer that is selectively removed prior to growth of the top source/drain region. The top source/drain region may be confined by opposing dielectric layers.

7 Claims, 7 Drawing Sheets

(56) References Cited

U.S. PATENT DOCUMENTS

| | | |
|---|---|---|
| 9,954,102 B1 | 4/2018 | Mochizuki et al. |
| 2009/0042347 A1 | 2/2009 | Oyu |
| 2016/0365439 A1 | 12/2016 | Lin |
| 2017/0186742 A1 | 6/2017 | Balakrishnan et al. |

OTHER PUBLICATIONS

Hemanth Jagannathan et al., Published U.S. Appl. No. 15/831,354, filed Dec. 4, 2017, entitled Vertical Transport Field-Effect Transistor Including Dual Layer Top Spacer, pp. 1-25 plus 7 sheets formal drawings.

Hemanth Jagannathan et al., Unpublished U.S. Appl. No. 16/252,670, filed Jan. 20, 2019, entitled Vertical Transport Field-Effect Transistor Including Dual Layer Top Spacer, pp. 1-23 plus 7 sheets formal drawings.

Paul J. Otterstedt, List of IBM Patents or Patent Applications Treated As Related, pp. 1-2, May 28, 2019.

VERTICAL TRANSPORT FIELD-EFFECT TRANSISTOR INCLUDING AIR-GAP TOP SPACER

CROSS-REFERENCE TO RELATED APPLICATIONS

This patent application is a divisional of U.S. patent application Ser. No. 15/831,340 filed Dec. 4, 2017, entitled "VERTICAL TRANSPORT FIELD-EFFECT TRANSISTOR INCLUDING AIR-GAP TOP SPACER," the complete disclosure of which is expressly incorporated herein by reference in its entirety for all purposes.

BACKGROUND

The present invention relates generally to the electrical, electronic and computer arts and, more particularly, to vertical transistor structures.

Metal oxide semiconductor field-effect transistors (MOSFETs) include gate electrodes that are electrically insulated from operatively associated semiconductor channels by thin layers of dielectric material. MOSFETs having n-doped source and drain regions employ electrons as the primary current carriers while those having p-doped source and drain regions use holes as primary current carriers. Vertical transport field-effect transistors (VTFETs) have configurations wherein the current between the drain and source regions is substantially normal to the surface of the die. A vertical transport field-effect transistor may, for example, include a semiconductor pillar or fin having top and bottom regions comprising source/drain regions, the portion of the pillar between the source/drain regions defining a channel region. Junction field-effect transistors (JFETs) are characterized by doped, possibly vertical channel regions, p-n junctions on one or more sides of the channels, and ohmic contacts forming the source and drain regions.

Vertical transport FETs (VTFETs) are a promising alternative to standard lateral FET structures due to potential benefits, among others, in terms of reduced circuit footprint. A logic circuit comprising VTFETs can be referred to as a "vertical transport logic gate." VTFETs can potentially provide electronic devices comprising logic circuits with improved circuit density. Such logic circuits can be characterized by a lower-number CPP (cell gate pitch) versus comparable logic circuits comprising lateral FET layouts. Minimum wiring pitch can also be relevant for realizing denser vertical FET layouts.

BRIEF SUMMARY

A monolithic semiconductor structure including a vertical transport FET and fabrication of such a structure are aspects of inventions disclosed herein.

In one aspect, an exemplary method of fabricating a vertical transport field-effect transistor includes obtaining a first structure including: a vertically extending semiconductor fin including a top region, a bottom region, and a channel region between the top region and the bottom region, a bottom source/drain region adjoining the bottom region of the semiconductor fin, a gate dielectric layer above the bottom electrically insulating spacer and adjoining the channel region of the semiconductor fin, an electrically conductive gate electrode layer adjoining the gate dielectric layer, a bottom electrically insulating spacer between the bottom source/drain region and the gate electrode layer, a cavity bounded by first and second vertically extending dielectric layers, the top region of the semiconductor fin extending within the cavity, a dielectric liner, the bottom dielectric liner extending horizontally over the gate dielectric layer and the gate electrode layer, first and second divots extending downwardly from the cavity and located, respectively, between the top region of the semiconductor fin and the first and second vertically extending dielectric layers, and a sacrificial material over the bottom dielectric liner and within the first and second divots. The sacrificial material is removed and a faceted top source/drain region is epitaxially grown on the top region of the semiconductor fin and within the cavity such that a top spacer including open gaps is formed between the top source/drain region and the dielectric liner.

In a further aspect, a vertical transport field-effect transistor structure including an open gap top spacer is provided. The structure includes a semiconductor fin extending vertically with respect to the substrate. The semiconductor fin includes a top region, a bottom region, and a channel region between the top region and the bottom region. A bottom source/drain region adjoins the bottom region of the semiconductor fin. A gate dielectric layer adjoins the channel region of the semiconductor fin and an electrically conductive gate electrode layer adjoins the gate dielectric layer. A bottom dielectric spacer is located between the bottom source/drain region and the gate electrode layer. A cavity is bounded by first and second vertically extending dielectric layers. The top region of the semiconductor fin extends within the cavity. First and second divots extending downwardly from the cavity and are located between the top region of the semiconductor fin and the first and second vertically extending dielectric layers. A faceted, epitaxial top source/drain region is on the top region of the semiconductor fin and within the cavity. A dielectric liner extends over the gate dielectric layer and the gate electrode layer. A top spacer including first and second open gaps is between the faceted, epitaxial top source/drain region and the dielectric liner.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments or elements thereof can be implemented in the form of a computer program product including a computer readable storage medium with computer usable program code for performing the method steps indicated. Furthermore, one or more embodiments or elements thereof can be implemented in the form of a system (or apparatus) including a memory, and at least one processor that is coupled to the memory and operative to perform exemplary method steps. Yet further, in another aspect, one or more embodiments or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques as disclosed herein can provide substantial beneficial technical effects. By way of example only and without limitation, one or more embodiments may provide one or more of the following advantages:

Operational benefits of VTFETs;

Reduced parasitic capacitance.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Figure 1:
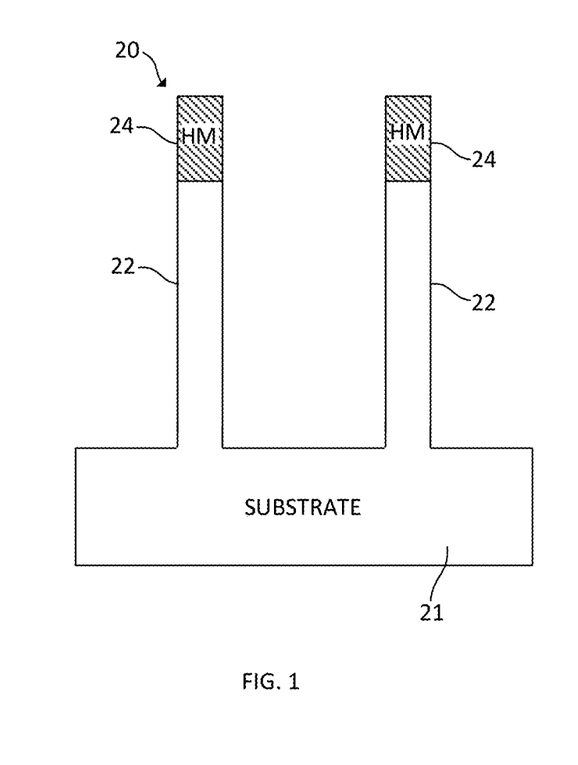
FIG. 1 is a schematic, cross-sectional illustration of a bulk semiconductor substrate including an array of parallel fins and dielectric caps on the fins.

A structure 20 including a bulk semiconductor substrate 21 comprised of crystalline silicon is shown in FIG. 1. The substrate may be in the form of a wafer that is essentially undoped. An array of parallel fins 22 is formed from the substrate using, for example, a sidewall image transfer process. A hard mask (not shown) may be deposited over the substrate, including any features thereon, using conventional deposition techniques such as spin-on coating, CVD, plasma-assisted CVD, or other known techniques. The fins 22 are formed beneath portions of the hard mask that remain on the structure following mask patterning. Semiconductor fins 22 extending vertically with respect to the substrate are formed following partial removal of substrate material by an etching process such as a reactive ion etch (RIE). Dielectric caps 24 on the top surfaces of the fins 22 are the remaining portions of the hard mask (HM). Silicon nitride caps 24 are formed in some embodiments. While the fins 22 are shown as having vertical side walls and horizontal top surfaces in the schematic illustrations, it will be appreciated that the fins may have somewhat different configurations such as triangular configurations wherein the fin bases are wider than the tops of the fins. The structure 20 may accordingly include fins having sides that are not completely vertical. Fin heights are preferably equal. Fin heights, widths and spacing are further chosen in accordance with manufacturer preferences. Fin heights in some embodiments range between 10-50 nm. The substrate in one exemplary embodiment is a (100) substrate oriented such that the side walls of the monocrystalline silicon fins 22 are (110) surfaces. As discussed above, the side walls of the fins 22 may not be exactly vertical. Surfaces described as (110) surfaces herein are at least close to being (110) surfaces but may or may not be exactly (110) surfaces.

It will be appreciated that substrate 21 and fins formed therefrom may include one or more semiconductor materials. Non-limiting examples of suitable substrate materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Vertical transport devices can alternatively be formed on a semiconductor-on-insulator (SOI) substrate including a buried insulator layer.

Figure 2:
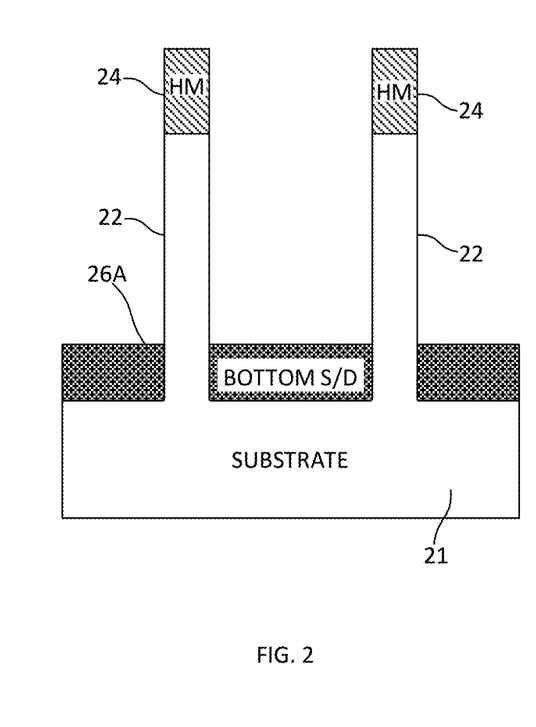
FIG. 2 is a view of the structure shown in FIG. 1 following formation of an epitaxial bottom source/drain layer.

Referring to FIG. 2, a heavily bottom doped source/drain layer 26A can be formed by epitaxial growth on the substrate 21 and bottom regions of the semiconductor fins 22 as discussed further below. The source/drain layer 26A is heavily doped with dopant(s) having a first conductivity type. The term "n-type" refers to the addition of impurities that contribute free electrons to an intrinsic semiconductor. In a silicon containing substrate, examples of n-type dopants, i.e. impurities, include but are not limited to antimony, arsenic and phosphorous. The term "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium.

The bottom source/drain layer 26A is can be formed using a bottom-up epitaxial growth process wherein the heavily doped source/drain layer is grown to certain height (thickness) such as, but not necessarily limited to from about 50 nm to about 250 nm, with about 100 nm to about 200 nm preferred. A fin liner (not shown, e.g. SiO$_2$ or SiN) prevents epitaxial growth from the fin sidewalls within and above the channel regions of the semiconductor fins 22 at this stage of the process. The epitaxially grown source/drain layer 26A can be doped in situ, and dopants may include, for example, an n-type dopant selected from a group of phosphorus (P), arsenic (As) and antimony (Sb), or a p-type dopant selected from a group of boron (B), gallium (Ga), indium (In), and thallium (Tl) at various concentrations. For example, in a non-limiting example, a dopant concentration range may be e20/cm$^3$ to e21/cm$^3$, with 4e20/cm$^3$ to 8e20/cm$^3$ preferred. The bottom source/drain layer 26A can include, but is not necessarily limited to, silicon (Si), silicon germanium (SiGe), or other semiconductor material.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition type apparatus, such as a low pressure chemical vapor deposition (LPCVD) apparatus. A number of different precursors may be used for the epitaxial deposition of the in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, disilane and combinations thereof. In other examples, when the in situ doped semiconductor material includes germanium, a germanium gas source may be selected from the group consisting of germane, digermane, halogermane, dichlorogermane, trichlorogermane, tetrachlorogermane and combinations thereof. The temperature for epitaxial silicon germanium deposition typically ranges from 450° C. to 900° C. Although higher temperature typically results in faster deposition, the faster deposition may result in crystal defects and film cracking. Examples of other epitaxial growth processes that can be employed in growing semiconductor layers described herein include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). By "in-situ" it is meant that the dopant that dictates the conductivity type of doped layer is introduced during the process step, e.g., epitaxial deposition, that forms the doped layer. The resulting bottom source/drain layer 26A includes an essentially flat top surface. The oxide or nitride fin liner can be removed following completion of the bottom source/drain layer. A diluted hydrofluoric acid (HF) solution may, for example, be employed to remove an oxide liner. Additionally, after bottom source/drain formation, a dopant drive-in anneal (900° C. to 1050° C.) is conducted for junction formation.

Figure 3:
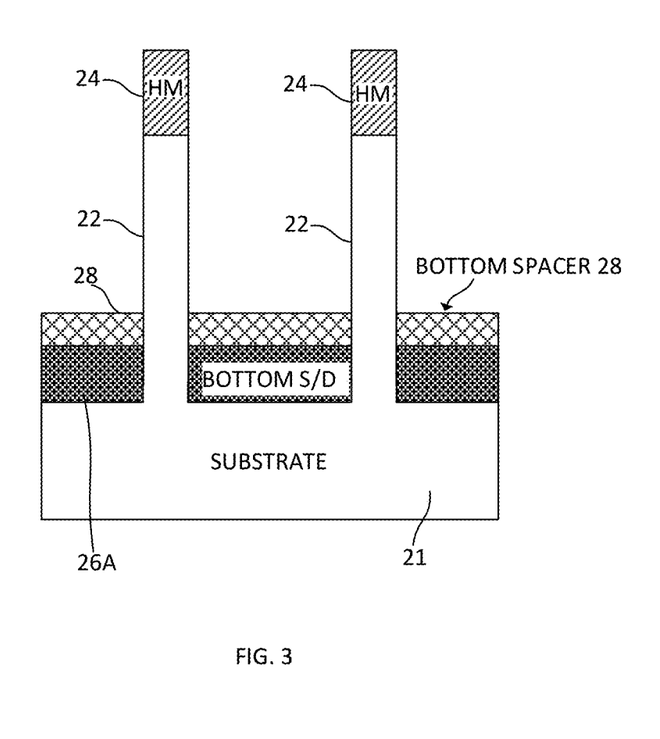
FIG. 3 is a schematical, cross-sectional view showing the structure of FIG. 2 following deposition of a bottom spacer.

A bottom spacer 28 is deposited to obtain a structure as shown in FIG. 3. The bottom spacer may comprise an electrically insulating material, for example, silicon dioxide, silicon nitride, SiOCN, or SiBCN. Other non-limiting examples of materials for the bottom spacer include dielectric oxides (e.g., silicon oxide), dielectric nitrides (e.g., silicon nitride), dielectric oxynitrides, or any combination thereof. The bottom spacer may have a thickness of about five to about ten nanometers, though such a range is not considered critical. The bottom spacer can be deposited directly on the bottom source/drain layer 26A using directional deposition techniques including, but not necessarily limited to high density plasma (HDP) deposition and gas cluster ion beam (GCM) deposition, or deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering.

Figure 4:
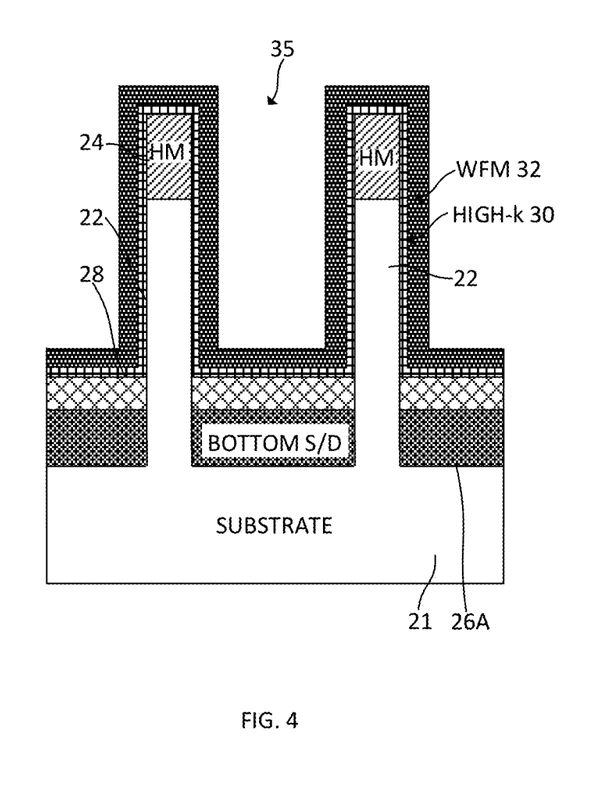
FIG. 4 is a schematical, cross-sectional view showing the structure of FIG. 3 following deposition of gate dielectric and gate metal materials.

A gate dielectric layer 30 and a work function metal (WFM) layer 32 are deposited sequentially to form a gate stack for the VTFET device, as schematically illustrated in FIG. 4. The gate dielectric layer adjoins the bottom spacer 28, the sidewalls of the semiconductor fins 22, and the dielectric caps 24 on the fins. Non-limiting examples of suitable materials for the gate dielectric layer 30 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric layer 30 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material may vary depending on the deposition process as well as the composition and number of high-k dielectric materials used. In some embodiments, the gate dielectric layer includes multiple layers.

The work function metal layer 32 is disposed over the gate dielectric layer to obtain a structure 35 as shown in FIG. 4. Non-limiting examples of suitable work function metals include p-type work function metal materials and n-type work function metal materials. P-type work function materials include compositions such as ruthenium, palladium, platinum, cobalt, nickel, conductive metal oxides, titanium nitride (TiN), and tantalum nitride (TaN) or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering. A gate-all-around (GAA) structure for the VTFET is thereby obtained, wherein the WFM is functional as a gate electrode.

Figure 5:
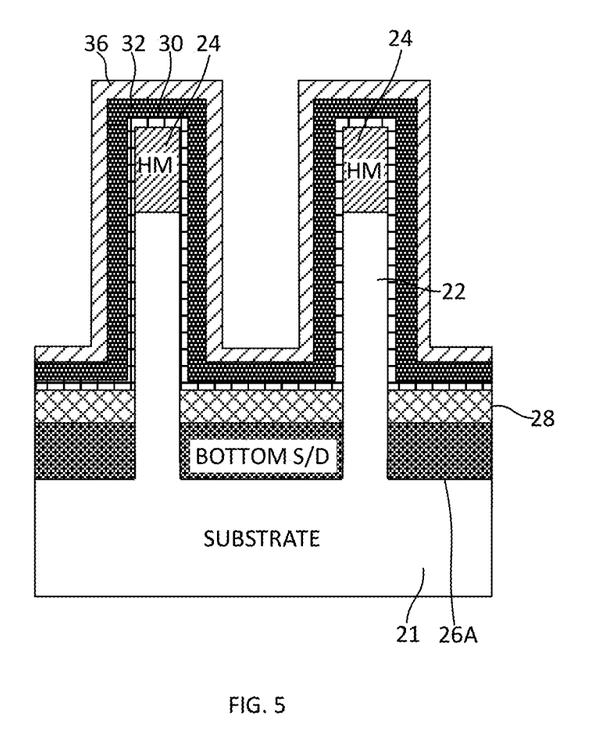
FIG. 5 is a schematical, cross-sectional view showing the structure of FIG. 4 following gate encapsulation.
Figure 6:
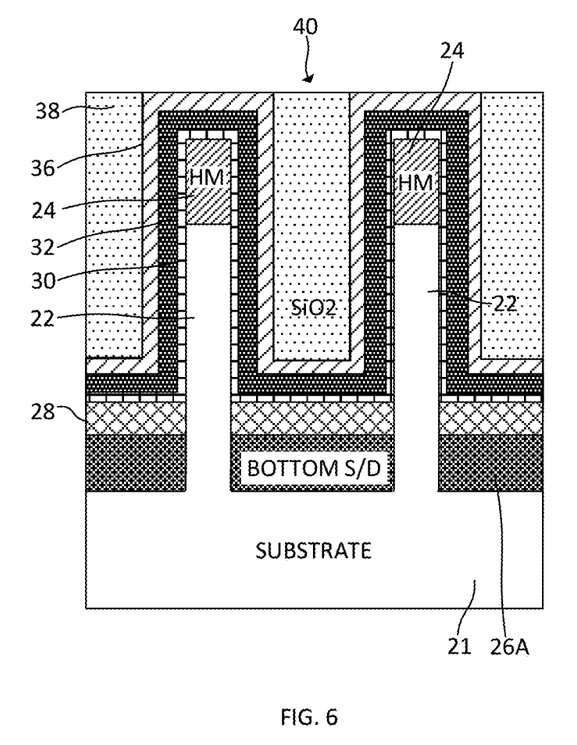
FIG. 6 is a schematical, cross-sectional view showing the structure of FIG. 5 following deposition of oxide material followed by planarization.

Referring to FIG. 5, a dielectric gate encapsulation layer 36 is deposited on the structure 35. The gate encapsulation layer is a silicon nitride layer in some embodiments in direct contact with the work function metal layer 32. The dielectric gate encapsulation layer may alternatively consist essentially of dielectric material(s) other than silicon nitride, for example, silicon oxynitride, SiBCN (silicon borocarbonitride), SiOCN (silicon oxycarbonitride), and/or SiOC (silicon oxycarbide). An oxide fill layer 38 is deposited over the gate encapsulation layer 36 and planarized to obtain a structure 40 as shown in FIG. 6. A chemical mechanical planarization (CMP) process may be employed to remove oxide fill material down to the top surface of the gate encapsulation layer above the semiconductor fins 22.

Figure 7:
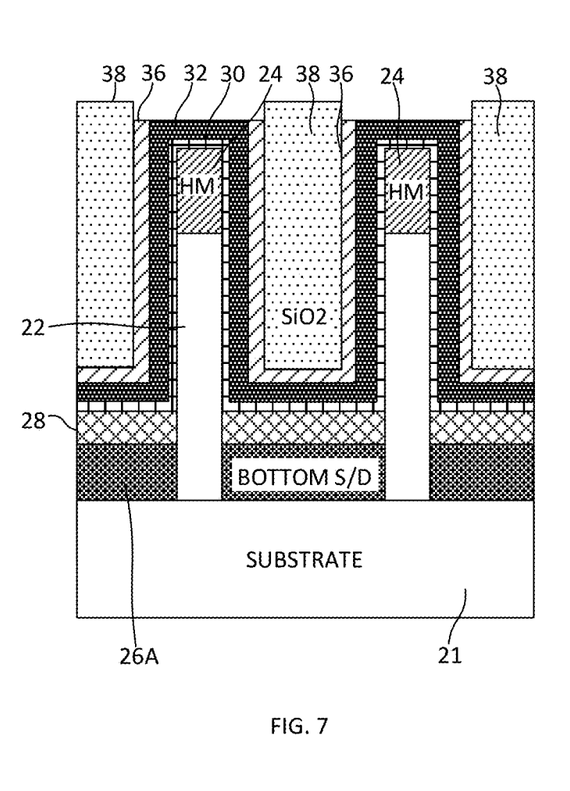
FIG. 7 is a schematical, cross-sectional view showing the structure of FIG. 6 following removal of encapsulation material above the fins.
Figure 8:
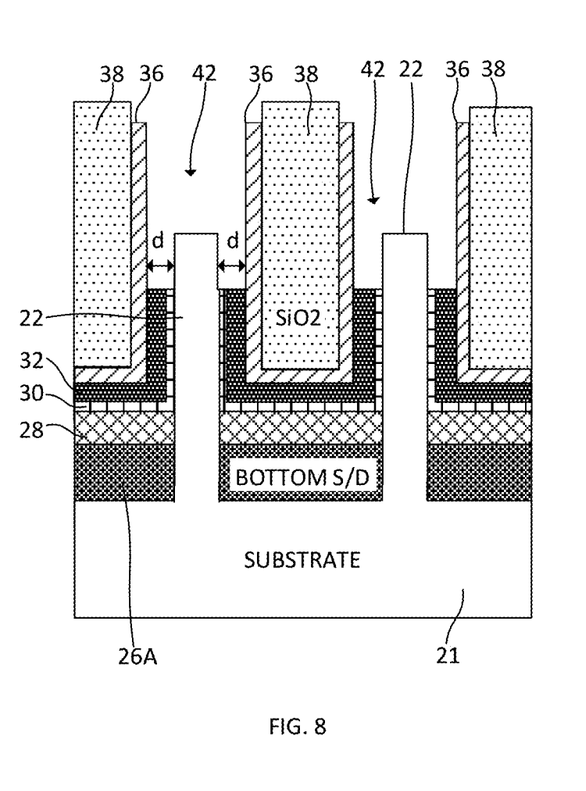
FIG. 8 is a schematical, cross-sectional view showing the structure of FIG. 7 following recessing of gate dielectric and gate metal materials.

An anisotropic etching process such as reactive ion etching or plasma etching can be employed to remove the exposed top surface portions of the gate encapsulation layer 36, as shown in FIG. 7. A top surface of the work function metal layer is thereby exposed. Sequential wet or dry etches, or combinations thereof, can be employed for etching the work function metal, hard mask (dielectric caps), and gate dielectric materials to form cavities 42 between vertical portions of the gate encapsulation layer 36. Timed etches may be employed. As shown in FIG. 8, the dielectric caps are completely removed from the semiconductor fins. The gate dielectric and work function metal materials are partially removed. The remaining vertical portions of the gate dielectric layer and work function metal layer 32 adjoin the channel regions of the semiconductor fins. Top portions of the semiconductor fins 22 extend above the gate stacks (30/32). As further shown in FIG. 8, the distance d between each fin sidewall and an opposing sidewall of the gate encapsulation layer 36 is about ten nanometers (10 nm) in one or more exemplary embodiments. The widths of the cavities 42, as measured between the inner surfaces of the oxide fill layer at the tops of the cavities 42, are about thirty-five nanometers (35 nm). The cavities include divot portions contiguous therewith and extending beneath the top surfaces of the fins.

Figure 9:
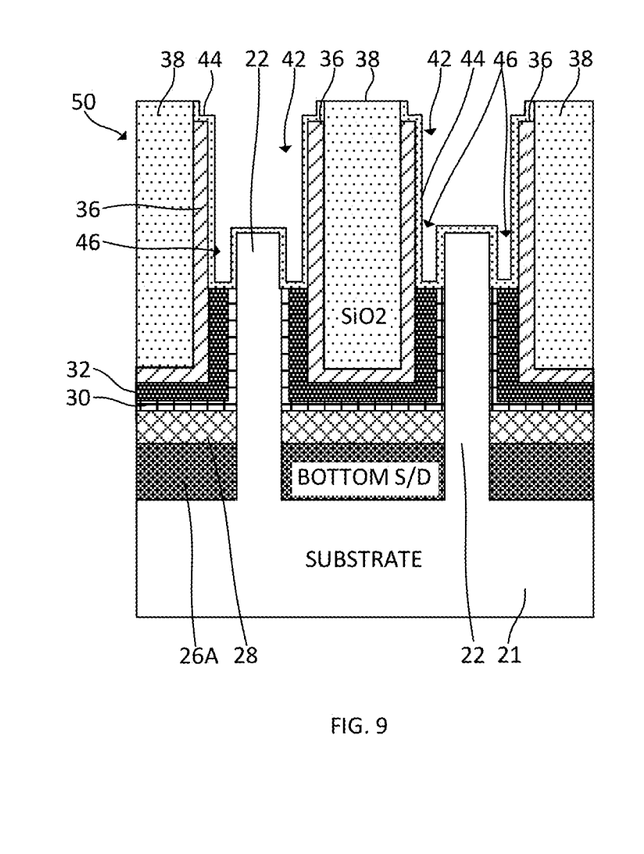
FIG. 9 is a schematical, cross-sectional view showing the structure of FIG. 8 following deposition of an oxide liner.

A thin oxide liner 44 is deposited on the structure using atomic layer deposition (ALD) or other suitable deposition process. In some embodiments, the oxide liner is a silicon dioxide liner having a thickness of about two nanometers (2 nm). The oxide liner 44 lines the cavities and divots. It adjoins the inner sidewalls of the gate encapsulation layer, the top surfaces of the gate stacks, and the exposed top regions of the semiconductor fins 22. In the resulting structure 50, as shown in FIG. 9, the divots 46 are bounded by portions of the oxide liner. The oxide liner 44 includes vertical portions adjoining the vertical portions of the gate encapsulation layer 36 and horizontal portions between the top surfaces of the gate stacks and the unfilled portions of the divots.

Figure 10:
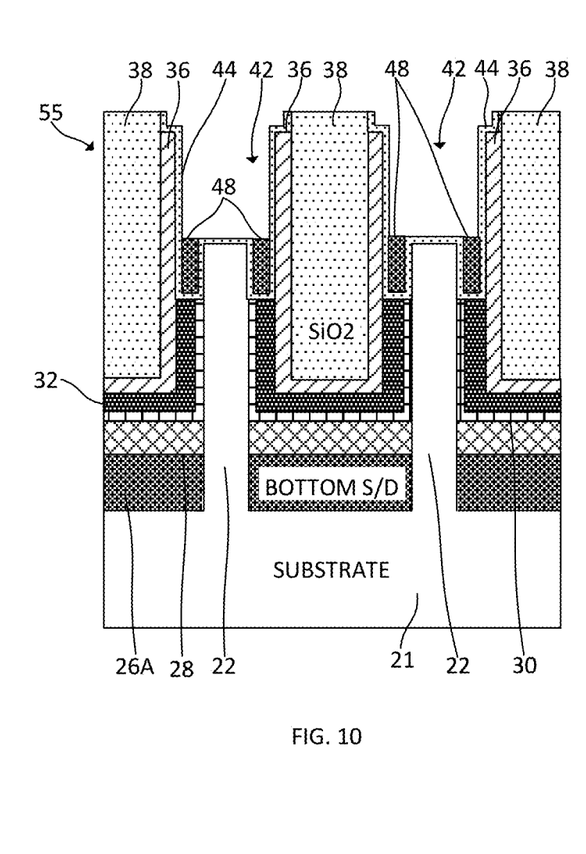
FIG. 10 is a schematical, cross-sectional view showing the structure of FIG. 9 following deposition and etch-back of sacrificial material.

A sacrificial material is deposited within the cavities 42, also filling the divots 46. The sacrificial material is etched back to the oxide liner portions on the top surfaces of the semiconductor fins. The sacrificial material forms dummy spacers 48 within the divots 46. In one embodiment, titanium dioxide ($TiO_2$) is employed as the sacrificial material forming the dummy spacers. Titanium dioxide can be deposited using chemical vapor deposition (CVD) or other suitable process. A standard basic SC1 solution (12.5% ammonium hydroxide solution, 12.5% hydrogen peroxide solution, and 75% water) can be used to selectively etch back the titanium dioxide layer at room temperature. The etchant chosen should be highly selective with respect to the removal of the oxide liner 44. Following a SC1 wet etch, a structure 55 as shown in FIG. 10 may be obtained. Silicon nitride also has high etch selectivity over a silicon dioxide liner and may alternatively be used as a sacrificial material in some embodiments.

Figure 11:
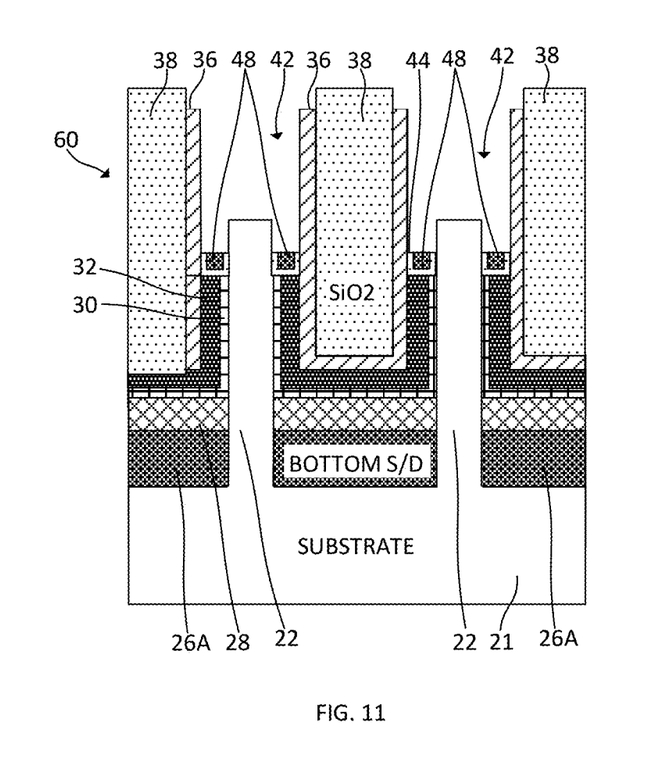
FIG. 11 is a schematical, cross-sectional view showing the structure of FIG. 10 following recessing of the sacrificial material and etching of the oxide liner.

Referring to FIG. 11, the dummy spacers 48 are recessed beneath the plane of the top surfaces of the semiconductor fins. The portions of the oxide liner 44 above the recessed dummy spacers are removed to obtain the structure 60 as schematically illustrated. The remaining portions of the oxide liner 44 have U-shaped cross-sectional configurations. Etching of oxide liner may be conducted using a diluted hydrofluoric acid (HF) solution or by an isotropic reactive ion etch that leaves residual oxide liner material in the divots and adjoining the recessed dummy spacers 48. A diluted HF etch is selective to both titanium dioxide and silicon nitride, leaving the sacrificial material substantially intact.

Figure 12:
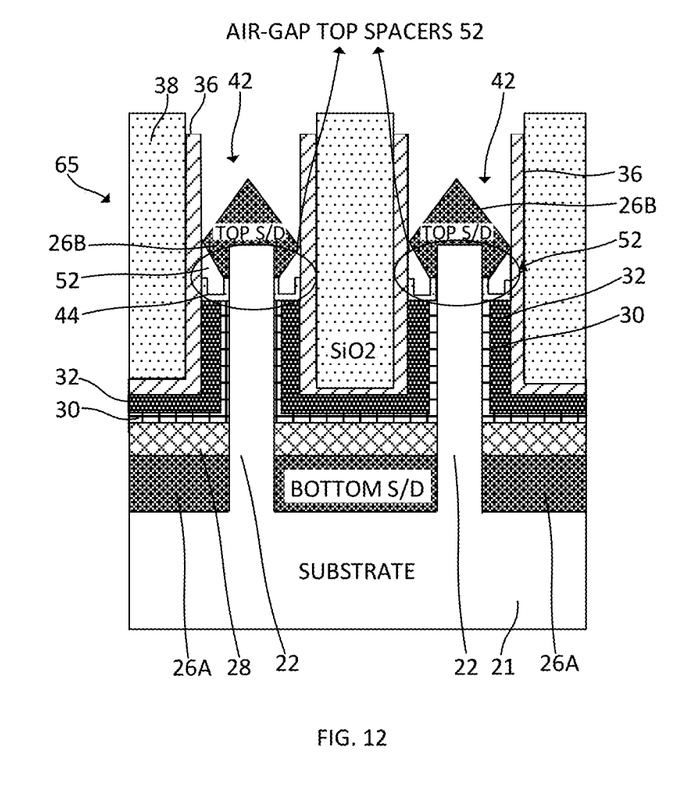
FIG. 12 is a schematical, cross-sectional view showing the structure of FIG. 11 following removal of the sacrificial material and epitaxial growth of top source/drain regions.

The sacrificial material forming the dummy spacers 48 is selectively removed, leaving the residual portions of the oxide liner 44 within the bottom portions of the divots 46. The oxide liner at this stage of the process includes a horizontal portion adjoining the top ends of the gate dielectric layer and gate electrode layer. It further includes vertical portions that adjoin the top regions of the semiconductor fins 22 and parts of the gate encapsulation layer 36. The top regions of the semiconductor fins include sidewalls extending above the oxide liner 44 that allow epitaxial growth of semiconductor materials thereon. Top source/drain regions 26B are then epitaxially grown on the exposed surfaces of the top region of the semiconductor fin 22. Unlike the bottom source/drain regions 26A that are epitaxially grown as a layer on the substrate, the top source/drain regions form diamond-shaped structures. As discussed above, the semiconductor fin sidewall surfaces are (110) surfaces in one or more embodiments such that epitaxial growth thereon produces in diamond-shaped (faceted) structures due to the fact that the growth rate on (111) planes is considerably less than on (110) planes. Self-limiting diamond-shaped structures can accordingly be formed. Growth of the top source/drain regions is confined within the vertical portions of the gate encapsulation layer. In exemplary embodiments, the diamond-shaped top source/drain regions 26B are in situ doped silicon or silicon germanium and extend about ten nanometers (10 nm) laterally with respect to each vertical sidewall of the semiconductor fins 22. The doping levels may be about the same as those in the bottom source/drain regions. The width of the confined source/drain epitaxial regions should be about twenty-five to thirty nanometers (25-30 nm). Fin thickness (width) is about five to ten nanometers (5-10 nm). Gate metal thickness on each side is about ten nanometers (10 nm). Assuming the exposed top portion of each semiconductor fin is about six nanometers (6 nm), the height of the top source/drain regions grown thereon will be about nineteen to twenty-four nanometers (19-24 nm). The vertical portions of the gate encapsulation layer 36 above the gate metal should accordingly be between twenty-five and fifty nanometers (25-50 nm) to ensure the epitaxial top source/drain regions 26B are confined within the cavities 42. As shown in FIG. 12, the resulting structure 65 include open gaps 52 that function as top spacers to reduce the capacitance between the top source/drain regions 26B and the gate stack. The gaps are located between the faceted bottom surfaces of the top source/drain regions 26B and the portions of the oxide liner that protect the gate stack. The gaps 52 are substantially uniform in dimension. In contrast, gap formation relying on the non-conformal deposition of dielectric material and subsequent etch-back may lead to variation and non-uniformity of gap spacers formed in such a manner.

Figure 13:
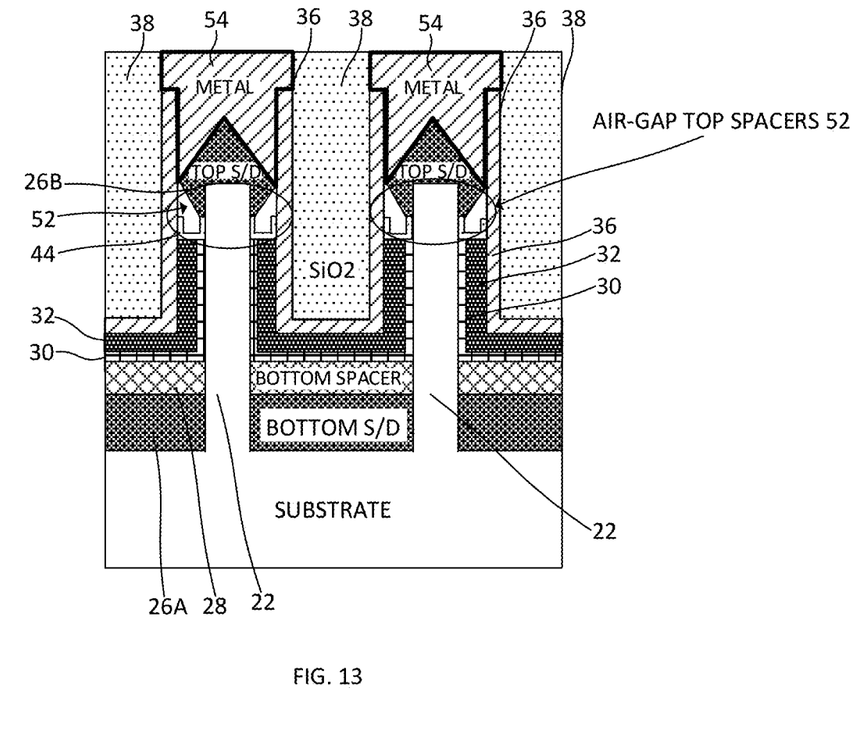
FIG. 13 is a schematical, cross-sectional view showing the structure of FIG. 12 following formation of top source/drain contacts.

Top source/drain contacts 54 are formed to obtain the structure 70 shown in FIG. 13. Contact metal is confined to the upper portions of the cavities 42 above the top source/drain regions 26B. The source/drain contacts are formed using suitable metallization processes. In one or more embodiments, a metal such as nickel, nickel platinum, or titanium is deposited on the top source/drain regions 26B. The thickness of the deposited metal layer may be between eight to ten nanometers (8-10 nm). Electroless deposition processes and atomic layer deposition (ALD) are among the techniques that may be employed. Metal deposition may be followed by low temperature silicidation to form metal silicide or metal germanide layers (not shown) on the top source/drain regions 26B. Annealing temperatures between 300-420° C. form uniform layers of metal-rich silicides. A contact metal layer, for example tungsten (W) or cobalt (Co), is deposited on the structure, filling the cavities 42 and directly contacting the metal silicide layers formed on the top source/drain regions 26B. In some embodiments, the contact metal layer is a tungsten (W) layer that is deposited using a tungsten hexafluoride source with silane. Chemical vapor deposition conducted between 300-400° C. using tungsten hexafluoride precursor chemistry may, for example, be employed to deposit a tungsten layer. Contact material may, for example, alternatively include tantalum (Ta), aluminum (Al), platinum (Pt), gold (Au), titanium (Ti), palladium (Pd) or any combination thereof. The contact material may be deposited by, for example, CVD, PECVD, PVD, plating, thermal or e-beam evaporation, or sputtering. A planarization process such as CMP is performed to remove any electrically conductive material (overburden) from the top surface of the structure 70. Gate and bottom source/drain contacts (not shown) are also formed within the structure 70. Metal is deposited only in the upper portions of the cavities 42 as the top source/drain regions 26B prevent metal from entering the gaps 52.

The electronic devices comprising the structure 70 may be incorporated within electronic circuitry that, in one or more exemplary embodiments, comprises an integrated circuit (IC). In other words, the electronic circuitry may include an assembly of electronic components, fabricated as a monolithic unit, in which active and passive devices and their interconnections are formed. The resulting circuit may perform one or more functions (e.g. logic, memory, sensing) depending on the arrangement of the components.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material when forming a semiconductor structure. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* 1$^{st}$ *Edition*, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Given the discussion thus far, it will be appreciated that, in general terms, an exemplary method of fabricating a vertical transport field-effect transistor includes obtaining a first structure 60 as schematically illustrated in FIG. 11. The first structure includes a vertically extending semiconductor fin 22 including a top region, a bottom region, and a channel region between the top region and the bottom region. A bottom source/drain layer 26A adjoins the bottom region of the semiconductor fin 22. A bottom electrically insulating spacer 28 is above the source/drain layer. A gate dielectric layer 30 is above the bottom electrically insulating spacer and adjoins the channel region of the semiconductor fin 22. An electrically conductive gate electrode layer adjoins the gate dielectric layer. The first structure 60 includes first and second vertically extending dielectric layers, which are portions of a gate encapsulation layer 36 shown in FIG. 11. A bottom dielectric layer 44 extends horizontally over the gate dielectric layer and the gate electrode layer. A cavity 42 is bounded by the first and second vertically extending dielectric layers. The top region of the semiconductor fin 22 extends within the cavity. First and second divots (46 in FIG. 9) extend downwardly from the cavity 42 and are located, respectively, between the top region of the semiconductor fin 22 and the first and second vertically extending dielectric layers (vertical portions of layer 36). A sacrificial material (dummy spacers 48) is over the bottom dielectric layer and within the first and second divots. The sacrificial material is selectively removed such that the bottom dielectric layer 44 remains on the top edge portions of the gate dielectric layer and the gate electrode layer. A faceted top source/drain region 26B is epitaxially grown on the top region of the semiconductor fin 22 and within the cavity such that open gaps 52 ("air-gaps") are formed between the top source/drain region 26B and the bottom dielectric layer 44, thereby reducing capacitance between the top source/drain region 26B and the gate electrode layer 32.

Further given the above discussion, a vertical transport field-effect transistor structure includes a substrate 21 and a semiconductor fin 22 extending vertically with respect to the substrate. The semiconductor fin includes a top region, a bottom region, and a channel region between the top region and the bottom region. A bottom source/drain region 26A adjoins the bottom region of the semiconductor fin. A gate dielectric layer adjoins the channel region of the semiconductor fin and an electrically conductive gate electrode layer adjoins the gate dielectric layer. A bottom dielectric spacer 28 is between the bottom source/drain region 26A and the gate electrode layer 32. A cavity 42 is bounded by first and second vertically extending dielectric layers. In the exemplary embodiment, the vertically extending dielectric layers are portions of a gate encapsulation layer 36. The top region of the semiconductor fin 22 extends within the cavity 42. First and second divots (46 in FIG. 9) extending downwardly from the cavity and are located between the top region of the semiconductor fin 22 and the first and second vertically extending dielectric layers. A faceted, epitaxial top source/drain region 26B is on the top region of the semiconductor fin 22 and within the cavity 42. A dielectric liner 44 including a horizontal portion extends over the gate dielectric layer 30 and the gate electrode layer 32. A top spacer including first and second open gaps 52 is located between the faceted, epitaxial top source/drain region and the dielectric liner 44.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this disclosure.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having low-noise devices therein.

An integrated circuit in accordance with aspects of the present disclosure can be employed in essentially any application and/or electronic system where the use of VTFETs would be beneficial. Given the teachings of the present disclosure provided herein, one of ordinary skill in the art will be able to contemplate other implementations and applications of embodiments disclosed herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated. As the term is used herein and in the appended claims, "about" means within plus or minus ten percent.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.76(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A vertical transport field-effect transistor structure, comprising:
    a substrate;
    a semiconductor fin extending vertically with respect to the substrate, the semiconductor fin including a top region, a bottom region, and a channel region between the top region and the bottom region;
    a bottom source/drain region adjoining the bottom region of the semiconductor fin;
    a gate dielectric layer adjoining the channel region of the semiconductor fin;
    an electrically conductive gate electrode layer adjoining the gate dielectric layer;
    a bottom dielectric spacer between the bottom source/drain region and the gate electrode layer;
    first and second vertically extending dielectric layers;
    a cavity bounded by the first and second vertically extending dielectric layers, the top region of the semiconductor fin extending within the cavity;
    first and second divots extending downwardly from the cavity and located between the top region of the semiconductor fin and the first and second vertically extending dielectric layers;
    a faceted, epitaxial top source/drain region on the top region of the semiconductor fin and within the cavity;
    a dielectric liner extending over the gate dielectric layer and the gate electrode layer; and
    a top spacer comprising first and second open gaps between the faceted, epitaxial top source/drain region and the dielectric liner.

2. The vertical transport field-effect transistor structure of claim 1, further wherein the faceted, epitaxial top source/drain region contacts the first and second vertically extending dielectric layers.

3. The vertical transport field-effect transistor structure of claim 2, wherein the fin is integral with the substrate and the bottom source/drain layer is epitaxial with respect to the substrate.

4. The vertical transport field-effect transistor structure of claim 3, wherein the dielectric liner includes U-shaped portions including vertical segments adjoining the top region of the semiconductor fin.

5. The vertical transport field-effect transistor structure of claim 3, wherein the substrate comprises silicon.

6. The vertical transport field-effect transistor structure of claim 5, further including a metal contact within the cavity and extending above the top source/drain region.

7. The vertical transport field-effect transistor structure of claim 5, wherein the top region of the fin and each of the first and second vertically extending dielectric layers are separated by a distance of about ten nanometers.

* * * * *